United States Patent [19]

Nimmagadda

[11] Patent Number: 4,540,596
[45] Date of Patent: Sep. 10, 1985

[54] METHOD OF PRODUCING THIN, HARD COATING

[75] Inventor: Rao R. Nimmagadda, Fountain Valley, Calif.

[73] Assignee: Smith International, Inc., Newport Beach, Calif.

[21] Appl. No.: 644,488

[22] Filed: Aug. 27, 1984

Related U.S. Application Data

[62] Division of Ser. No. 492,317, May 6, 1983, abandoned.

[51] Int. Cl.$^3$ ............................................. B05D 3/06
[52] U.S. Cl. ................................. 427/37; 427/39; 427/248.1; 427/249; 427/282; 427/295; 427/327
[58] Field of Search ............... 427/37, 39, 248.1, 249, 427/282, 295, 327

[56] References Cited

U.S. PATENT DOCUMENTS

| | | |
|---|---|---|
| 3,480,341 | 11/1969 | Hickernell . |
| 3,604,523 | 9/1971 | Lichte . |
| 3,913,988 | 10/1975 | Scales et al. . |
| 3,922,038 | 11/1975 | Scales . |
| 3,946,817 | 3/1976 | Prince . |
| 4,412,899 | 11/1983 | Beale . |

Primary Examiner—Bernard D. Pianalto
Attorney, Agent, or Firm—Robert G. Upton

[57] ABSTRACT

Rolling cone rock bit seal and bearing hard surfaces having been made fully ready for assembly are first provided thin overlay coatings to enhance the resistance of the surfaces to both wear and corrosion. The coating is an engineering ceramic comprised of at least one nonmetallic element selected from a list consisting of C, O, and N, combined with at least one metallic element selected from a list consisting of Ti, Hf, Zr, Nb, Ta, W, B, Al, Co, and Cr. In a modified physical vapor deposition process, the selected coating will be developed at a temperature not to exceed 400° Fahrenheit.

4 Claims, 2 Drawing Figures

METHOD OF PRODUCING THIN, HARD COATING

CROSS REFERENCE TO RELATED APPLICATIONS

This is a division of application Ser. No. 492,317, filed May 6, 1983 abandoned.

BACKGROUND OF THE INVENTION

1. Field of the Invention

This invention pertains to the manufacture of rolling cone rock bits. More specifically, this invention pertains to a manufacturing step to be used for the enhancement of the surfaces of the seals and the bearings in a rolling cone rock bit.

Rolling cone rock bits are used to bore holes and wells into hard rock for the exploration and production of mineral resources. They commonly operate under a column of abrasive fluid which is used to cool the bit and flush cuttings from the bottom of the hole.

A rolling cone rock bit comprises a rock bit body having a first pin end which forms a connection to the distal end of a drill pipeline and a second journal end from which are cantilevered one or more bearing journals. A rolling conically-shaped cutter, bearing teeth, is rotatably mounted by a bearing to each supporting journal.

In use, the bit is forced into the rock with sufficient energy that the teeth of the cutter penetrate the rock and then the bit is rotated, presenting a continuous parade of cutting teeth to the rock. All of the energy required to force those teeth into the rock is transmitted through the journal bearings. The failure of one seal or one bearing is tantamount to the catastrophic failure of the bit. Bits are required to drill ever deeper, into ever harder rock and at increasingly higher temperatures and rotary speeds. These are the very elements which are most difficult for a bearing or a seal to withstand. It is in the very nature of both seals and bearings that their failure is the result of the failure of their own sliding surfaces.

2. Description of the Prior Art

U.S. Pat. No. 3,913,988 calls for carburizing and hardening of bearing surfaces, followed by the application of a dry, solid film lubricant for purposes of break-in. Available coatings would not last beyond this period.

U.S. Pat. No. 3,922,038 calls for a combination of carburizing and boronizing, followed by hardening and tempering of bearing surfaces.

U.S. Pat. No. 3,946,817 is addressed to treatment of a cutter cone only. The cone bore is pack-carburized while the cone exterior is simultaneously gas-carburized, followed by hardening and tempering. This yields a harder surface treatment to the bearing and a softer, tougher surface treatment to the cone exterior.

These patents are all directed specifically at bearing surfaces, however, they do not exclude the adjacent seal gland surfaces which they no doubt benefit. Generally, all rock bit journals and cones receive some property enhancement by heat treating, but still more is needed.

Drillers working in certain geographical areas have been encountering very corrosive environments which attack the seal gland surfaces, causing early bit failures. This corrosive attack impedes the economic recovery of resources in certain petroleum, sour gas and geothermal reserves.

It is the classical view of a bearing couple that one member should be relatively hard and the other member relatively soft. Wear debris from the hard member imbeds itself more or less harmlessly in the softer metal whereas the softer member is considered to be more or less "self-healing" in that it transfers wear debris from one damage site to repair another.

Ever increasing demands are placed upon bearings and, in the quest to meet these demands in rock bit bearings, two things seem increasingly evident: first, that no single material seems to answer all of the problems therefore interest is turning to composite materials and, secondly, that this usage demands a bearing couple of two very hard materials. Various known surface treatments and platings have been exploited toward this end. Other more attractive coatings have been relatively useless in this application because of the very high temperatures required for their application. These high temperatures distort machined parts and upset previously applied heat treatments. A temperature of 400° Fahrenheit or below would be required to be fully compatible with currently used heat treat processes. Coatings, or platings, which are applicable to this temperature range do not yield bearing quality surfaces harder than those surfaces obtainable with good heat treat practices.

The most promising method for applying coatings of the type sought would be one of two general methods of vapor deposition.

In the chemical vapor deposition process, parts are heated in a reactive gas atmosphere which decomposes to two materials upon contact with the parts. A first material, which is deposited upon the part, and a second material which is later removed as a waste "off gas". Certain of these processes resemble that of gas carburizing and are carried on at atmospheric pressure. Others involve varying degrees of vacuum. One process, called plasma-assisted chemical vapor deposition, permits the process to take place at a lower temperature, generally above 1470° Fahrenheit. For instance, titanium carbide requires temperatures at a range from 1650° to 1850° Fahrenheit; a coating of titanium nitride requires temperatures between 1650° to 2010° Fahrenheit; whereas the even harder coating of aluminum oxide commonly requires temperatures between 1920° and 2010° Fahrenheit. An ionic plasma is maintained in the vicinity of the parts which provides a part of the energy required by the process. Without the plasma, all of the energy is thermally supplied. This plasma is adjusted to provide an amount of energy where the rate of decomposition and the rate of deposition mutually peak. The process is further disadvantaged in that the final deposition rate is prohibitively slow. In addition, the "off gasses" produced are generally very toxic, therefore dangerous to be around and disposal is difficult.

Physical vapor deposition is defined as one in which the actual coating material is vaporized in a vacuum chamber and condensed upon the surface of the part. The parts are heated, prior to coating, to temperatures above the limit of heat treat safety.

Overlay coating by physical vapor deposition has been developed primarily for the protection of super alloys and refractory metals at very high temperatures. Such protection is required, for instance, on the vanes of jet engine turbines. The coatings deposited generally comprise a monoaluminide component contained in a matrix of cobalt, chromium, nickel, and iron, plus a trace of yttrium to aid bonding. Typical coatings applied in this manner run from two to six mils thick and require a post-heat treatment to consolidate and stabilize the interface bond between coating and substrate.

High quality coatings of titanium nitride and titanium carbide, as thick as 0.001 inch, are produced by physical vapor deposition requiring process temperatures of 900° Fahrenheit to 1000° Fahrenheit.

Process variations stem from the method chosen to vaporize the source metal. Common methods are: direct resistance or induction heating, sputtering, electron beam heating, or electric arc.

The source metal is held at ground potential. A nearby positive potential strips the vapor of loosely bound electrons to produce a cloud of metallic cations which are accelerated to the heated metal parts by a strong negative bias. Like light, the cations always travel in straight lines.

When resistive or inductive heating is chosen, a positive electrode defining an aperture is employed, being close to the grounded source metal in the manner of a lens directed toward the negatively biased parts.

In the electron beam evaporative process, the source metal is melted in a small retort by a beam of electrons drawn electrostatically from a heated cathode. The cathode is held at a high negative potential and the source metal is at ground potential. An ionizing electrode is located above the retort and biased about 50 volts to 500 volts positive to strip electrons from the vapor. The metallic cations then deposit on the parts. Note that the molten source metal emits only from the top surface, requiring that it be placed low in the chamber with the parts fixtured overhead.

Sputtering is any of a number of processes wherein the source metal is atomized ballistically by bombardment with energetic particles. The "particles" are generally cations of argon, present as a low pressure atmosphere, ionized by ion beam or a plasma. These processes operate at temperatures as low as 165° Fahrenheit to coat heat-sensitive materials which are not necessarily conductive. Materials herein of interest require process temperatures of from about 900° Fahrenheit to about 1200° Fahrenheit.

When an electric arc is used to vaporize metal, the arc cathode is the consumable source metal. The positive anode strips the vapor of electrons to produce metallic cations to coat the parts.

SUMMARY OF THE INVENTION

An object of this invention is the provision of a hard, tenacious, anti-galling and corrosion-resistant coating on at least the seal gland and bearing surfaces of a rolling cone rock bit.

Another advantage of this invention is the provision of a very hard, slippery and wear-resisting coating, which is applied at low temperature, on the surfaces of the seal gland and bearings of a rolling cone rock bit.

Still another advantage of this invention is the provision of a very thin and very uniform surface coating on the surfaces of a seal gland and bearings of a rolling cone rock bit which is a finished surface, requiring no further treatment of any kind.

In a modified physical vapor deposition process, a selected coating will be thinly and uniformly deposited upon at least selected areas of otherwise finished manufactured parts. The coating is comprised of carbide, oxide, or nitride, of an element selected from a list consisting of Ti, Hf, Zr, Nb, Ta, W, B, Al, Co, and Cr. The parts to be coated, having at least the surfaces to be coated fully machined, are thoroughly cleaned using methods of vapor degreasing and typical preplating type acid and basic baths. The parts are placed in a vacuum chamber and pumped down to a pressure of $1 \times 10^{-5}$ torr. Spaced apart from the fixtured parts are a multiplicity of electric arc cathodes. These cathodes are fabricated of the chosen metallic component of the coating specie. Each cathode has an adjacent copper striker electrode used to initiate the arc. Once initiated, the chamber walls are used as anodes. The fixtured parts, being negatively biased by a high potential of from about 500 volts to about 5000 volts relative to the cathodes are heated and cleaned by cation bombardment, when the arcs are powered, to a required process temperature between about 200° Fahrenheit and 400° Fahrenheit. A reactant gas is supplied to the vacuum chamber to a partial pressure of about $1 \times 10^{-3}$ torr. The bias potential is reduced to a range of about 50 volts to about 500 volts and controlled to adjust the velocity of the metallic cations. Deposition rate is independently controlled by regulating arc current. During coating the parts may be biased with alternating current to radio frequency, direct current, or a combination. This bias is used to maintain process temperature and to promote ionization of the reactant gas immediately surrounding the parts while agitating and mixing that portion of the plasma to form the ceramic coating compound. In the active plasma field, the coating specie forms an integral composite bond with the part surfaces by way of ionic interaction. The process continues long enough to build up a coating thickness of between about 0.00005 inch to 0.001 inch.

The loaded side of the journal bearing of a premium prior art bit is commonly relieved and filled with a stellitelike material to provide a hard bearing surface. Such a hard pad has a microhardness of approximately 600 KHN. Titanium nitride, on the other hand, has a microhardness of approximately 2000 KHN. The strength of the journal is reduced somewhat by relieving the journal for the application of the hard pad material. That strength is not regained by the installation of the hard pad material. An inlaid hard pad is required to be minimally 65 to 70 thousandths of an inch thick for pad integrity. The instant invention is advantaged in that, in replacing the hard pad, maximum journal strength is retained.

An advantage of this invention is that selected areas may be coated, leaving the remaining areas uncoated.

Another advantage of this invention is that the coating provided is extremely smooth and uniform and requires no further finishing of any kind.

Still another advantage of this invention is that the coating process is carried on at a temperature sufficiently low so that no interference is generated with the heat treatment already given to the parts.

Yet another advantage of this invention is that it provides a selection of desirable coatings not previously available for rock bit bearings or seal surfaces—coatings of reasonably pure, predetermined chemical composition and at desirable and controllable rates of production.

The above noted objects and advantages of the present invention will be more fully understood upon a study of the following description in conjunction with the detailed drawings.

DESCRIPTION OF THE PREFERRED EMBODIMENTS AND BEST MODE FOR CARRYING OUT THE INVENTION

Figure 1:
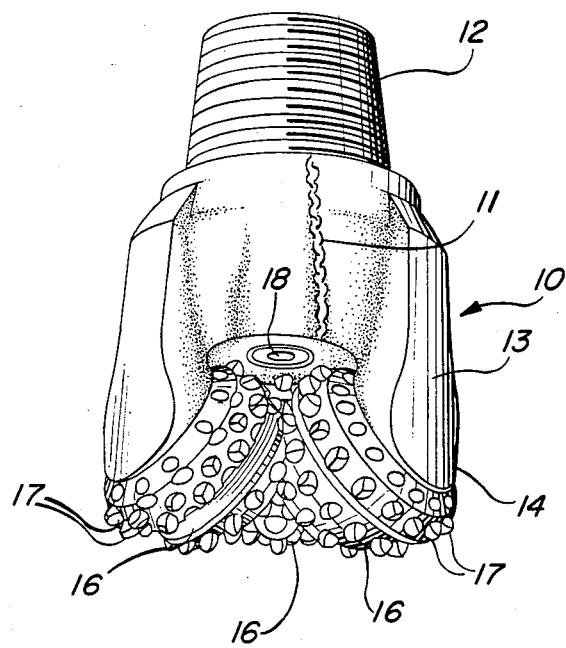
FIG. 1 is a perspective view of a typical three cone rotary rock bit.

Turning now to FIG. 1, a rock bit, generally designated as 10, consists of body 13, an upper pin end 12 and a lower journal end 14. Rotary cones 16 each support a multiplicity of cutting teeth 17 and are mounted on journals (not shown). The journals are cantilevered from end 14 of rock bit body 13 and directed radially inward. One or more jet nozzles 18 direct a flow of fluid toward the spaces between adjacent cones 16.

Figure 2:
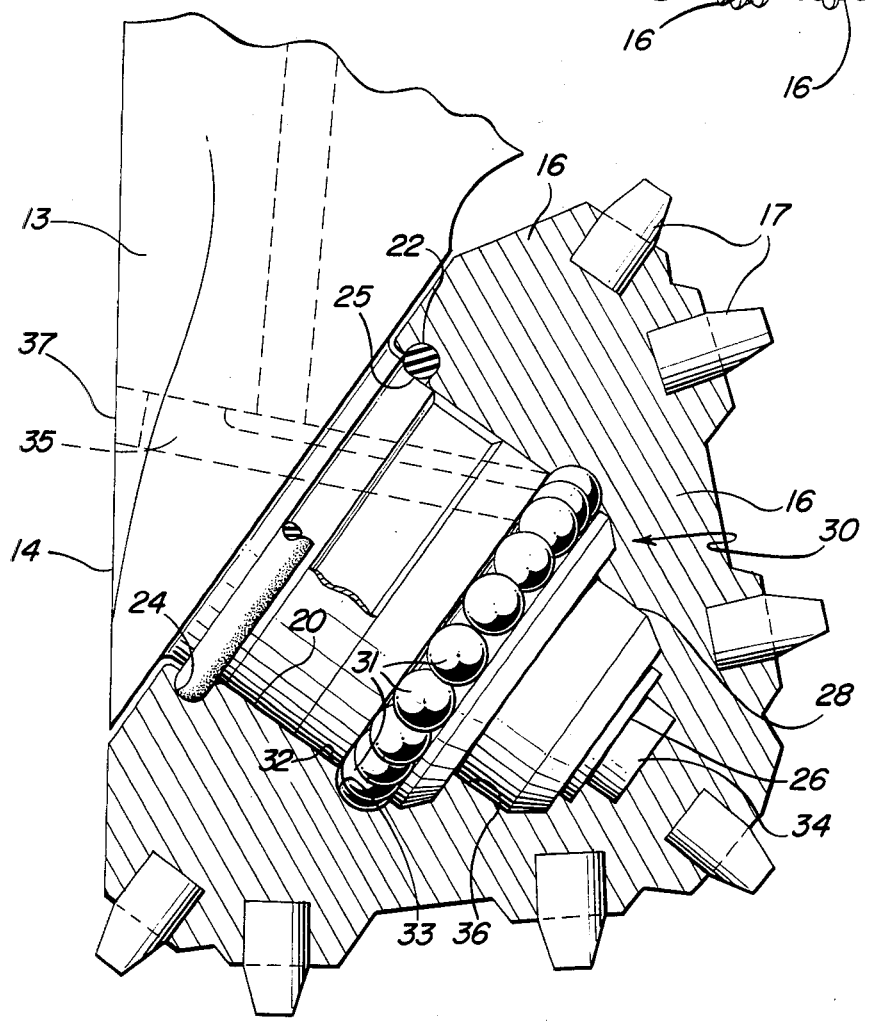
FIG. 2 illustrates part of a rotary cone rock bit, showing a journal and a sectioned rotary cutter cone mounted thereon.

In FIG. 2, cone 16 has been sectioned to reveal a journal, generally designated as 30, in enlarged detail. Journal 30 is supported cantilevered from the journal end 14 of bit body 13. Major features of the journal are a sealing surface 25, a journal bearing surface 20, a spindle bearing surface 28, and a thrust bearing surface 26. A circular ball race (not shown) partially houses ball bearings 31 which are used for retaining the cone upon the journal and for resisting back thrust. The cone 16 has features within its bore which complement the journal. Groove-shaped seal gland 24 houses seal 22 adjacent journal bearing surface 32. Ball race 33 partially houses ball bearings 31. The cone bore is reduced to provide spindle bearing surface 26 and reduces once more to provide the blind pocket in which is housed thrust button bearing element 34.

In a modified physical vapor deposition process, a selected coating will be thinly and uniformly deposited upon at least selected areas of otherwise finished manufactured parts. This coating is an engineering ceramic comprised of at least one element selected from a list consisting of Ti, Hf, Zr, Nb, Ta, W, B, Al, Co, and Cr, combined with at least one element selected from a list consisting of O, N, and C.

In selecting a coating for the seal ring groove 24 in the cone and seal surface 25 on the journal, the desired properties include corrosion resistance as well as abrasive wear resistance and lubricity. Surfaces of the journal bearing 32, the ball race 33, the spindle bearing 36 and thrust bearing 26 of the cone 16 and surfaces of the journal bearing 20, the spindle bearing 28, exposed surfaces of the thrust button 34, and the ball race of journal 30, being at this point finish machined and metallurgically hard and supportive, now require a coating which is extremely hard, resistant to abrasive wear and lubricious. Presently the preferred coating material is titanium nitride which has all of these properties.

In an unlubricated bearing couple, for instance where cone journal bearing surface 32 slides under load against journal bearing surface 20, and, assuming that both structures are substantially hard and unyielding, then the wear rate between the bearing surfaces may be substantially and measurably decreased by overlay coating both surfaces with a super hard coating like titanium nitride. A surprisingly greater decrease in wear rate may be realized, however, by overcoating only one of the two surfaces. The advantages of using dissimilar metals in sliding surfaces, long noted in materials softer than steel, still exist in materials much harder than steel but at a reduced magnitude.

In a friction bearing, if an unbroken film of lubricant can be maintained between the metal surfaces at all times, there is no wear produced. When the film is broken and metal touches metal, immediate wear is produced. In a rock bit the bearing environment is one of extremely heavy shock loads, high bearing temperatures, unpressured lubrication and low rotary speeds. Under these conditions, metal-to-metal contact is more the mode of operation than the exception. Thus, if any significant extension is to be realized in bearing life, that bearing had best be analytically considered to be unlubricated. It would follow logically therefore, to either coat the member with the most concentrated wear pattern, namely, the stationary journal, with a super hard overlay coating or with the harder of a pair of dissimilar hard overlay coatings, applying then the softer of the two to the complementary bearing surfaces. Currently preferred selections would be to use titanium nitride on the journal and seal gland surfaces or to use titanium nitride on the journal bearing surfaces and titanium carbide on the cone bore surfaces. It would, of course, be obvious to use dissimilar consecutive overlay coatings on any specific areas, as is practiced on carbide cutting tool inserts.

The process used in the instant invention draws from the foregoing prior art. This new process produces high quality coatings at process temperatures between 200° Fahrenheit and 400° Fahrenheit and is therefore useful on prefinished rock bit surfaces. This is a modified physical vapor deposition process in as much as at least one component of the coating specie is directly evaporated in a reactive gas atmosphere containing the other components.

The coating must be applied before assembly of the cutter cone 16 on the journal 30 while the bearing areas are thus exposed. It should be noted in this regard that virtually any area of a rock bit, particularly rock cutter elements, i.e., the cutter cone 16 and the teeth 17, may benefit in some measure by being coated with a super hard overlay and that masking conserves neither energy nor material. Specific areas which must later be welded or machined must be masked. For example, at one stage in the production of a rock bit, the body 13 is in three separate 120° leg segments, being split along the longitudinal axis. Each individual segment carries one journal. When the cutter 16 is assembled upon the journal 30, it is retained by ball bearings 31 which are loaded into place through a hole through the journal (FIG. 2). The cone retention balls are retained in place by a long, specially shaped ball retention plug 35 which in turn is retained in place by being welded to the bit body segment at the ball plug opening 37. Adjoining surfaces formed on each 120° segment cannot be coated by the instant process because, after assembly of the cutter cone on the journal, the segments are welded together into a single body 13 along longitudinal lines 11 (FIG. 1). The last machining operation to be performed is the threading of the uncoated pin end 12 of body 13. These specific areas (pin end, adjoining leg segments, etc.) and any additional areas which are held at option to be uncoated must therefore be masked before loading in the coating chamber.

Component parts ready for coating are first chemically cleaned by methods familiar to the electroplating industry. These methods include solvent vapor degreasing and alternate acid and basic baths. The parts are then fixtured in a vacuum chamber which is pumped down to a pressure of approximately $1\times 10^{-5}$ torr.

Physical vapor deposition processes are limited to line-of-sight use. The vapors have a point source and areas shadowed from that source will not be coated.

A plurality of electric arc cathodes are positioned in the chamber somewhat removed from the parts in such a way that they shadowlessly illuminate the important areas to be coated. These cathodes are made of the metal coating component desired. A copper striker electrode adjacent each cathode is used to initiate an arc. Once initiated, the walls of the chamber take over as an anode.

The parts are biased negatively relative to the grounded metal cathodes by an externally controlled high voltage supply, thus cleaning and heating the parts by cation bombardment until a required process temperature is reached between about 200° Fahrenheit and about 400° Fahrenheit.

Chamber pressure is now raised slightly to about $1\times 10^{-3}$ torr by the addition of a reactive gas, chosen in accordance with the specie to be coated. If, for instance, the coating is to be titanium nitride, then the titanium is supplied in pure form from the metal ion source and the gas atmosphere introduced will be nitrogen. If the deposited specie is to be titanium carbide, then the reactive atmosphere introduced would be acetylene. Various atmospheres which may be used for different coatings are well known in the field.

During coating, part bias serves to maintain process temperature and to provide energy to support an elevated deposition rate. This bias ionizes and agitates the reactant gas around the parts. This field may be operated in any mode from negative direct current to radio frequency.

Operator reduction and regulation of the bias level controls the velocity of transport of metal ion to the parts and thereby the energy of impact. Deposition rate is controlled by the level of current flow across the arcs.

The process is carried on long enough to build up a coating of the desired thickness. The thickness range considered useful for the cited purposes range from about 0.00005 inch to about 0.001 inch. The preferred thickness range is from 0.00015 inch to 0.0003 inch. No further processing is required to develop or enhance the properties of this coating.

All of the equipment and materials necessary to practice this coating process are commercially available, for instance, from Multiarc Vacuum Systems, Inc., 261 East Fifth St., St. Paul, Minn., 55101.

It will of course be realized that various modifications can be made in the design and operation of the present invention without departing from the spirit thereof. Thus, while the principal preferred construction and mode of operation of the invention have been explained in what is now considered to represent its best embodiments, which have been illustrated and described, it should be understood that within the scope of the appended claims, the invention may be practiced otherwise than as specifically illustrated and described.

I claim:

1. A method of producing a thin, hard coating on selected surfaces of bearings, seal glands and cutting elements of rotary cone rock bit components by overlay coating said surfaces with an engineering ceramic comprised of at least one metallic element selected from a list consisting of Ti, Hf, Zr, Nb, Ta, W, B, Al, Co, and Cr, combined with at least one nonmetallic element selected from a list consisting of O, N, and C, by a modified physical vapor deposition process comprising the steps of:

cleaning said surfaces of said components of said rock bit chemically, said surfaces to be free of residue, masking surfaces of said components which are to remain uncoated, loading said components into a vacuum coating chamber, locating at least one electric arc cathode metal vapor source spaced apart from said components in unobstructed view of said surfaces to be coated, said cathode is comprised of said metallic element, said cathode is cooperative with an anode, reducing atmospheric pressure within said chamber to about $1\times 10^{-5}$ torr, supplying a high voltage bias of from about 500 volts to about 5000 volts to said components, said bias being negative with respect to said cathode, powering said vapor source to produce a first ionic plasma to further clean said surfaces and heat said components to a process temperature between about 200° Fahrenheit and about 400° Fahrenheit, supplying selected said nonmetallic element to said chamber as a reactant gas in quantity sufficient to raise said pressure within said chamber to about $1\times 10^{-3}$ torr, lowering said high voltage bias to between about 50 volts to about 500 volts to maintain said process temperature, depositing said ceramic until a coating of between about 0.00005 inch and 0.001 inch thickness has been deposited, stopping said deposition process, raising pressure within said chamber to about one atmosphere, and removing said components from said chamber.

2. The method as set forth in claim 1 wherein said coating has been deposited to a thickness of between about 0.00015 inch and 0.0003 inch.

3. The method as set forth in claim 1 wherein said high voltage bias after lowering of said high voltage bias comprises at least one current selected from a list consisting of direct current, alternating current, and radio frequency current.

4. The method as set forth in claim 1 wherein a wall of said vacuum chamber serves as said anode for said vapor deposition process.

* * * * *